US009553717B2

(12) United States Patent
Khan et al.

(10) Patent No.: US 9,553,717 B2
(45) Date of Patent: Jan. 24, 2017

(54) SYSTEMS AND METHODS FOR CLOCK AND DATA RECOVERY

(71) Applicant: ANALOG DEVICES GLOBAL, Hamilton (BM)

(72) Inventors: Muhammad Kalimuddin Khan, Rochestown (IE); Philip Quinlan, Glounthaune (IE); Kenneth J. Mulvaney, Coolaney (IE)

(73) Assignee: Analog Devices Global, Hamilton (BM)

( * ) Notice: Subject to any disclaimer, the term of this patent is extended or adjusted under 35 U.S.C. 154(b) by 77 days.

(21) Appl. No.: 14/218,697

(22) Filed: Mar. 18, 2014

(65) Prior Publication Data

US 2015/0270948 A1    Sep. 24, 2015

(51) Int. Cl.
| | |
|---|---|
| *H04L 7/033* | (2006.01) |
| *H04L 7/10* | (2006.01) |
| *H03L 7/07* | (2006.01) |
| *H03L 7/08* | (2006.01) |
| *H04L 7/00* | (2006.01) |

(52) U.S. Cl.
CPC .............. *H04L 7/0331* (2013.01); *H03L 7/07* (2013.01); *H03L 7/0807* (2013.01); *H04L 7/0016* (2013.01); *H04L 7/10* (2013.01)

(58) Field of Classification Search
CPC ........ H04L 7/0331; H04L 7/0016; H03L 7/07; H03L 7/0807
USPC ........................................................ 375/327
See application file for complete search history.

(56) References Cited

U.S. PATENT DOCUMENTS

| | | | |
|---|---|---|---|
| 5,052,026 | A | 9/1991 | Walley |
| 7,352,831 | B2 | 4/2008 | Quinlan et al. |
| 7,719,368 | B1 | 5/2010 | Smith et al. |
| 7,995,698 | B2 | 8/2011 | Liu et al. |
| 2002/0150172 | A1 | 10/2002 | Yang et al. |
| 2007/0164835 | A1* | 7/2007 | Co ....................... H03C 3/0966 332/144 |
| 2008/0137790 | A1 | 6/2008 | Cranford et al. |
| 2010/0019855 | A1* | 1/2010 | Barrow ................... H03L 7/085 331/1 A |
| 2011/0068828 | A1* | 3/2011 | Anderson et al. ............. 327/48 |
| 2012/0051402 | A1* | 3/2012 | Cheng ................... G01S 19/243 375/148 |
| 2013/0034352 | A1 | 2/2013 | Liu |

FOREIGN PATENT DOCUMENTS

WO    WO2005086407    9/2005

OTHER PUBLICATIONS

Extended European Search Report in Application No. 15159085.8, mailed Sep. 2, 2015.

* cited by examiner

*Primary Examiner* — David S Huang
(74) *Attorney, Agent, or Firm* — Knobbe, Martens, Olson & Bear, LLP

(57) ABSTRACT

Apparatus and method for clock and data recovery are disclosed. A reset circuit counts clock cycles between edges of an input signal and resets a signal processing circuit that performs acquisition and tracking of a data stream when the clock cycle count is outside of a range. The signal processing circuit is further configured to perform acquisition and tracking according to a corrected data rate, which can be generated by data rate adjustment through a phase error correcting control loop and/or dithering between two data rates.

20 Claims, 10 Drawing Sheets

SYSTEMS AND METHODS FOR CLOCK AND DATA RECOVERY

BACKGROUND

Field of the Invention

The invention generally relates to electronics, and in particular, to clock and data recovery.

Description of the Related Art

Electronic systems such as transceivers use clock and data recovery modules to acquire and track incoming signals. A clock and data recovery, or symbol timing recovery, module often uses an oversampled digital phase locked loop (DPLL) operating at a clock frequency much higher than a target data rate. A clock and data recovery system may be designed to acquire demodulated data from a data stream that is modulated by various schemes such as frequency shift keying (FSK). The system can be further designed to measure phase error and adjust internal clock to achieve phase lock with the demodulated data and track the data, and a numerically controlled oscillator (NCO) generates a recovered clock accordingly. The system may operate plesiochronously and be designed to operate at a nominal rate of a standardized data schemes and may require constant adjustments as deviations from the nominal, standardized rate occur.

SUMMARY

One embodiment includes an apparatus, wherein the apparatus includes a signal processing circuit configured to acquire phase lock to an input signal in a first mode and to track the input signal in a second mode and a reset circuit configured to count cycles of a first clock signal between edges of the input signal to generate a count and reset the signal processing circuit when the count is outside of a range and the signal processing circuit is in the first mode.

One embodiment includes a system of a plurality of signal processing devices, at least one of which includes a signal processing circuit configured to acquire phase lock to an input signal in a first mode and to track the input signal in a second mode; and a reset circuit configured to count cycles of a first clock signal between edges of the input signal to generate a count and reset the signal processing circuit when the count is outside of a range and the signal processing circuit is in the first mode.

One embodiment includes a method of signal processing includes acquiring phase lock to an input signal in a first mode and to track the input signal in a second mode, counting cycles of a first clock signal between edges of the input signal to generate a count, and resetting processing of the signal when the count is outside of a range in the first mode.

BRIEF DESCRIPTION OF THE DRAWINGS

These drawings and the associated description herein are provided to illustrate embodiments of the invention and are not intended to be limiting.

DETAILED DESCRIPTION OF THE PREFERRED EMBODIMENT

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to cover such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Figure 1:
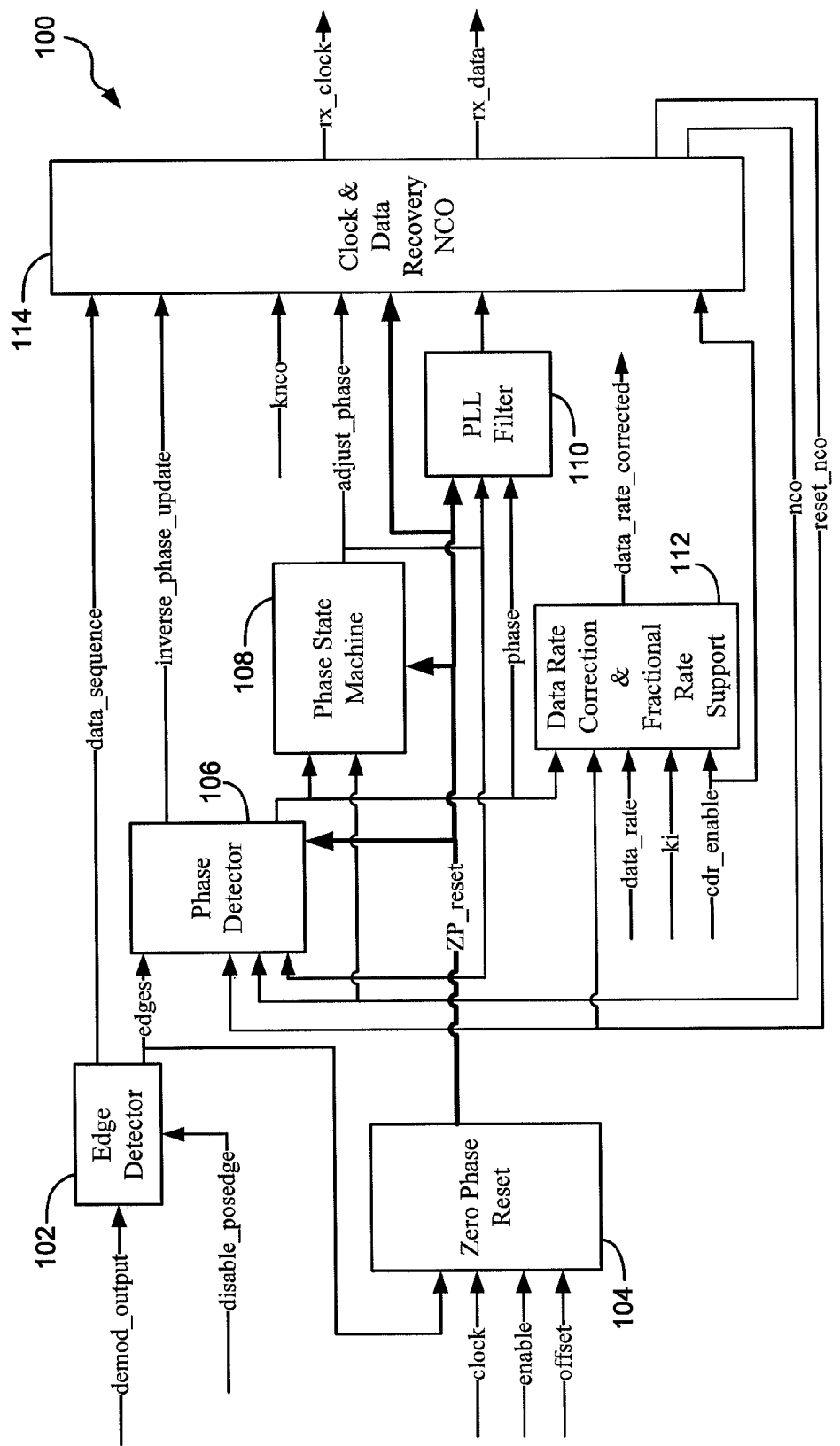
FIG. 1 is a schematic block diagram illustrating an example clock and data recovery system.

Referring to FIG. 1, an example clock and data recovery system will be described below. The illustrated system 100 includes an edge detector 102, zero phase reset circuit 104, phase detector 106, phase state machine 108, phase locked loop (PLL) filter 110, data rate correction and fractional rate support module 112, and clock and data recovery (CDR) numerically controlled oscillator (NCO) 114. The system 100 may be implemented within systems such as a network device to acquire and track a data stream that is modulated by one of various modulation schemes. Example modulation schemes include 2-FSK, or binary FSK, 3-FSK, or ternary FSK, and 4-FSK depending on the number of digital levels represented in discrete frequencies. The system 100 also may have an internal or local clock that is used to run each module of the system 100. A local clock signal may have a rate higher than a target data rate. For example, the local clock rate may be 32 times higher than the target data rate. However, the local clock signal can have a rate that varies in a very broad range and other applicable rates can be used and will be readily determined by one of ordinary skill in the art. The system 100 is configured to receive a data signal and implement techniques to ameliorate the effects of noise on the data signal.

An input signal to the system 100 is provided to a demodulator (not shown), which provides a demodulated signal demod output as an output. The type of demodulator will vary based on the system 100. The edge detector 102 detects edges of an output signal of the demodulator. The edge detector 102 can be implemented by, for example, exclusive-OR (XOR) gates and one or more delays. After the edge detector 102 generates an edges signal as an output. In one example, when the edge detector 102 detects an edge of the demodulated signal, the edge detector 102 can generate a pulse as will be described later in connection with FIG. 4. Edge detecting functions of the edge detector 102 may be selectively enabled or disabled, and the edge detector 102 can be configured to detect either positive edges or negative edges or both of the demodulated signal. For example, the edge detector 102 may receive a control signal that disables positive edge detection of the edge detector 102 triggering signal processes following the edge detector 102 only when a negative edge is detected. The edges signal from the edge detector 102 is provided as an input to the phase detector 106 and the zero phase reset circuit 104.

The edge detector 102 generates the edges signal as described above as the system 100 receives data, which can be accompanied by noise. For example, when an input to the system 100 is disconnected or is not being driven by an output signal, the resulting noise can interfere with the acquisition of an input signal when it eventually appears. Incoming data streams to the system 100 can be preceded and followed by random noise having Gaussian distribution with zero mean value. A data sequence can include a stream of symbols of unit intervals in duration. The data sequence may be preceded by a specific preamble sequence that varies based on the modulation scheme of the data. For example, a demodulated data sequence of +1, −1, +1, −1, . . . relative to the zero mean (which would be translated to the 2−FSK preamble sequence of 101010 . . . ) should have zero crossings at approximately every 32 counts of the local clock signal when the local clock signal is set to about 32 times of the data rate, for example. The preamble is detected to acquire phase lock to the input signal. On the other hand, noise that precedes the demodulated data sequence can have more frequent zero crossings compared to the data stream, and in turn, the edges signal from the edge detector 102 can generate more frequent unit pulses signaling zero-crossings while the system 100 receives noise as opposed to data.

The zero phase reset circuit 104 generates a reset signal that resets various modules of the illustrated system 100, including the phase detector 106, the phase state machine 108, the PLL filter 110, and the CDR NCO 114 while the illustrated system 100 is acquiring the input signal. After the input signal is acquired and is being tracked, the zero phase reset circuit 104 does not need to operate. In the illustrated embodiment, the zero phase reset circuit 104 receives, among others, the edges signal from the edge detector 102, a local clock signal, and an offset value. As described above, the zero phase reset circuit 104 utilizes the frequent zero-crossings due to noise to reset the CDR NCO 114, which can assist the acquisition of the input signal. The zero phase reset circuit 104 includes an internal counter to count local clock cycles between the pulses of the edges signal and activates a reset signal when the counter value is not within a given range based partly on the offset value.

Since the zero phase reset circuit 104 uses the frequency of zero-crossings of the incoming stream to operate, the zero phase reset circuit 104 can readily operate even when the input signal has a low amplitude that is close to or below the noise level. Moreover, zero crossings may occur at a known fixed rate given a specific modulation scheme preamble and the internal counting mechanism can be designed accordingly. For example, a demodulated signal for the 2-FSK preamble is +1, −1, +1, −1, . . . , and zero crossings for this signal would be at approximately 32 counts of the local clock signal when the local clock signal is set at about 32 times the data rate. By resetting various modules in the system 100 when the system 100 receives noise with frequent zero-crossings, the system 100 can achieve fast acquisition of the incoming signal with significantly improved acquisition time. The counting and reset functions of the zero phase reset signal are further described in conjunction with FIGS. 3 and 4 below.

The phase detector 106 determines the phase of the data signal with respect to the counter from the CDR NCO 114. The phase detector takes in, among others, the counter value, the edge detect signal from the edge detector 102, an adjust phase signal from the phase state machine 108, and the reset signal from the zero phase reset circuit 104. The phase detector 106 generates, among others, a phase signal, which may be a positive or negative unit pulse. The phase signal indicates whether the phase difference between the counter and the data signal is positive or negative. The phase signal from the phase detector 106 is fed to the phase state machine 108, the PLL filter 110, and the data rate correction and fractional rate support module 112.

The phase state machine 108 can be a finite state machine that updates phase information. The phase state machine 108 takes in, among others, the phase signal and the counter from the CDR NCO 114. The phase state machine 108 generates an adjust_phase signal based on the phase signal to control an NCO adjustment of the CDR NCO 114 base on the negative or positive sign of the phase signal. The phase state machine performs NCO adjustment at different positions within a bit interval for negative and positive phase update. For example, when the phase signal is positive and the counter from the CDR NCO 114 is greater than a first predetermined value, the phase state machine 108 may generate the adjust_phase signal indicating a delay in phase update until the NCO is less than the first predetermined value. When the phase signal is negative and the counter from the CDR NCO 114 is less than a second predetermined value, the phase state machine 108 may generate the adjust_phase signal indicating a delay in phase update until the NCO is greater than the second predetermined value. As a result the rising edge of the rx_clock may move according to the NCO adjustments as further illustrated in FIG. 8A-8B in order not to create a rising edge clock jitter. The adjust_phase signal from the phase state machine 108 is then fed to the phase detector 106, the PLL filter 110, and the CDR NCO 114.

The PLL filter 110 filters out unwanted frequencies while allowing wanted frequencies in the illustrated system 100. Depending on the incoming signal, characteristics of the system 100, and other possible internal or external disturbances, the PLL filter 110 may be configured to have specific gains for a range of frequencies, specific bandwidth to allow certain frequencies to pass while filtering out other frequencies, and/or specific desired timing responses for PLL functionality of the system 100.

The data rate correction and fractional rate support module 112 corrects programmed data rate according to an incoming data rate and also provides support for data rates differ from the programmed data rate by a fraction. The data rate correction and fractional rate support module 112 takes in, among others, the phase signal, gain parameters, such as $k_i$ and $k_p$ (not shown), and data rate value. Data rate can be adjusted based on accumulated phase error and through a control loop. Also, fractional data rate support can be achieved through accumulating fractions and alternating, or dithering, between two data rates. Functionalities of the data rate correction and fractional rate support module 112 are further described below with reference to FIGS. 5-9. Once the data rate is corrected and adjusted, the module 112 outputs corrected data rate that is fed to the general clock (not shown) for the system 100.

The CDR NCO 114 performs clock and data recovery based on the incoming signal to the illustrated system 100. The CDR NCO 114 receives, among others, the data sequence, the adjust phase signal from the phase detector 106, and the reset signal from the zero phase reset circuit 104. The CDR NCO 114 generates an rx_clock signal, which is a recovered clock signal in sync with the data sequence, and an rx_data signal, which is a recovered data signal based on the data sequence. The rx_clock signal may be generated by creating a clock signal of 50% duty cycle based on an internal counter value of the CDR NCO 114. For example, the rx_clock signal may be set low for the first half of the CDR NCO counter period and high for the second half of the CDR NCO counter period. The internal counter of the CDR NCO 114 may be preprogrammed, reset, and/or adjusted according to the various embodiments described herein.

Figure 2:
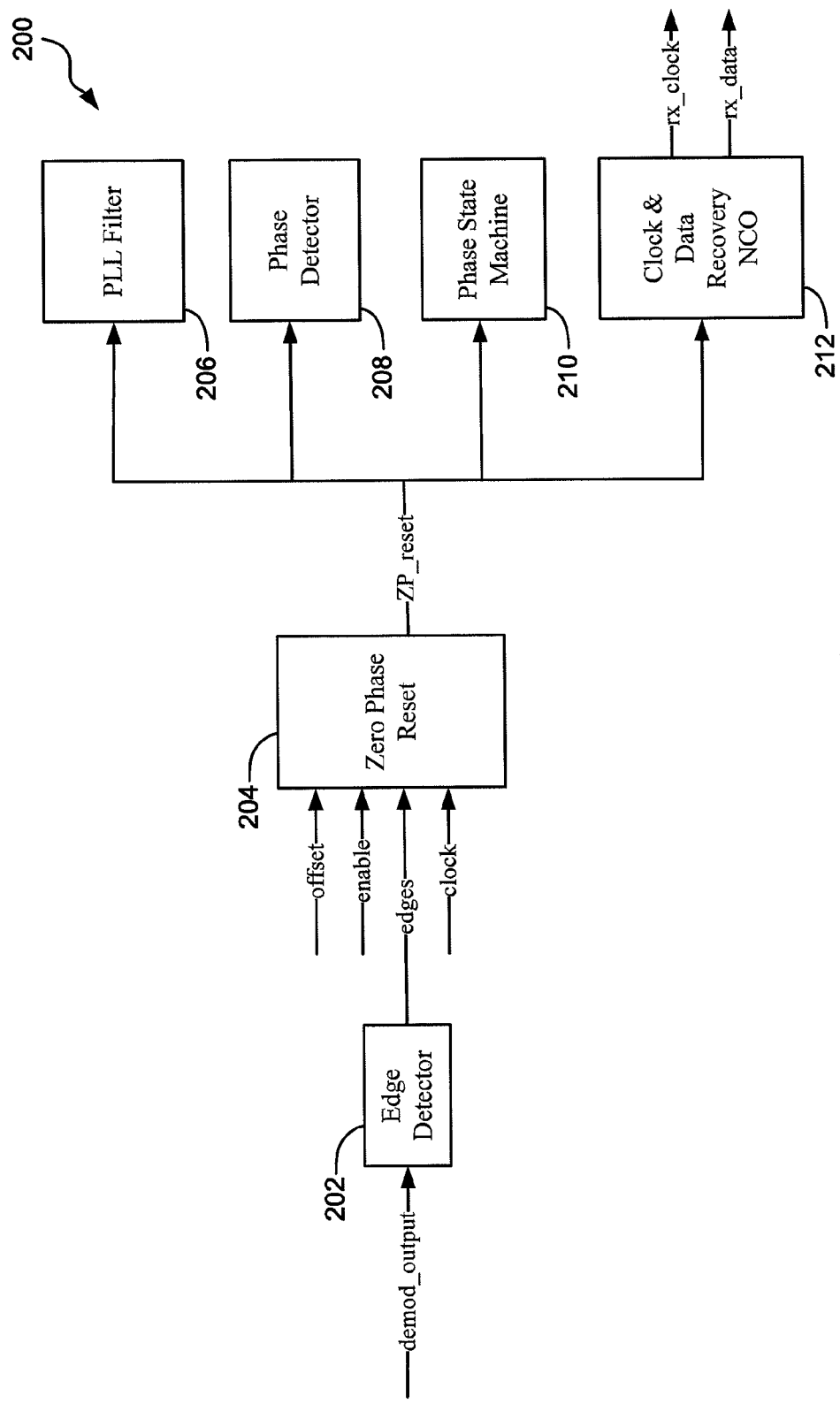
FIG. 2 is a schematic block diagram illustrating zero phase reset signal path according to one embodiment.

Referring to FIG. 2, an exemplary zero phase reset signal path is illustrated separate from the overall system in FIG. 1. The illustrated system 200 includes an edge detector 202, zero phase reset 204, PLL Filter 206, phase detector 208, phase state machine 210, and CDR NCO 212. The functionalities of the modules in the system 200 are substantially similar to those described in reference to FIG. 1. The zero phase reset signal resets accumulated phase error information for the PLL filter 206, resets the phase information for the phase detector 208, resets the phase state machine 210, and resets the internal NCO counter of the CDR NCO 212.

Figure 3:
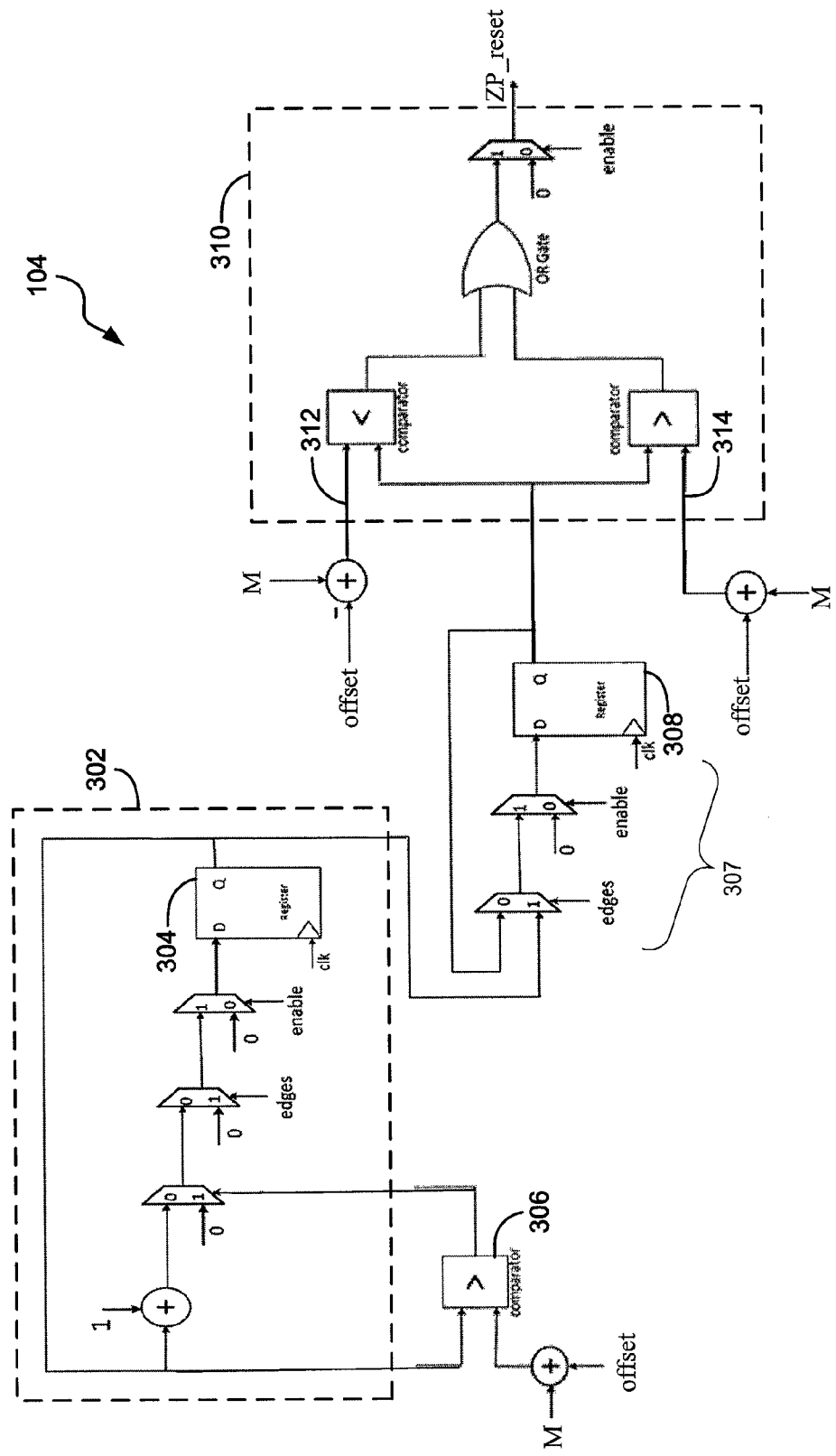
FIG. 3 is a schematic block diagram illustrating one embodiment of zero phase reset.

Referring to FIG. 3, one embodiment of the zero phase reset circuit 104 in FIG. 1 is described in greater detail as follows. The zero phase reset circuit 104 includes a counter 302 and a window comparator 310. The counter 302 may include multiple multiplexers to reset and/or enable the counter 302, and a counter register 304 to hold clock count between two edges. The clock count is reset to zero when the counter 302 receives a high or logic 1 from the edges signal, and the clock count value held at the counter register 304 will propagate to the next stage described below. Also, the zero phase reset circuit 104 includes a comparator 306 that compares the clock count value between two edges and the sum of a local clock multiplier and an offset, M+offset. The local clock multiplier, M, may be 32, for example, when the local clock is set at 32 times the data rate. Other multiplier values can be used. The offset may be a predetermined offset value such as 2 or 3 that may be the upper limit of the window comparator 310. After the clock count value reaches M+offset, the counter 302 will be reset such that the clock count value will be back to zero. In one embodiment, the CDR circuit 114 comprises a first counter for a numerically-controlled oscillator 114 and the reset circuit comprises a second counter 302, wherein the first counter is configured to receive the first clock signal and generate a second clock signal, wherein the second counter 302 is configured to receive the first clock signal as an input.

Still referring to FIG. 3, the clock counter from the counter register 304 may further go through a maximum clock count holding stage that may include another set of multiplexers 307 to reset and/or enable the maximum clock count holding stage and a maximum count register 308. When the zero phase reset circuit 104 receives a high or logic one from the edges signal, the clock count value held at the counter register 304 will propagate to this stage 307, and the maximum count register 308 will hold the maximum value of the clock count from the counter 302 between the edges. The maximum value of the clock count then will be propagated to the window comparator 310.

Still referring to FIG. 3, the window comparator 310 may include an upper limit comparator 314, a lower limit comparator 312, an OR gate, and a multiplexer to enable the window comparator 310. The upper limit of the window comparator 310 may be set at M+offset and the lower limit of the window comparator 310 may be set at M-offset, where M may be the local clock multiplier and offset is the predetermined offset value described above. When the maximum clock count value is below M-offset or above M+offset the window comparator 310 will activate a zero phase reset signal to reset the modules described in FIGS. 1 and 2. The foregoing logic is described with reference to "active high" logic such that a logic state is active or asserted when high or logic 1. Of course, in an alternative embodiment, active low logic can be used. When the maximum clock count value is between M-offset and M+offset, the window comparator 310 will not activate the zero phase reset signal and the modules described in FIGS. 1 and 2 will not be reset.

Figure 4:
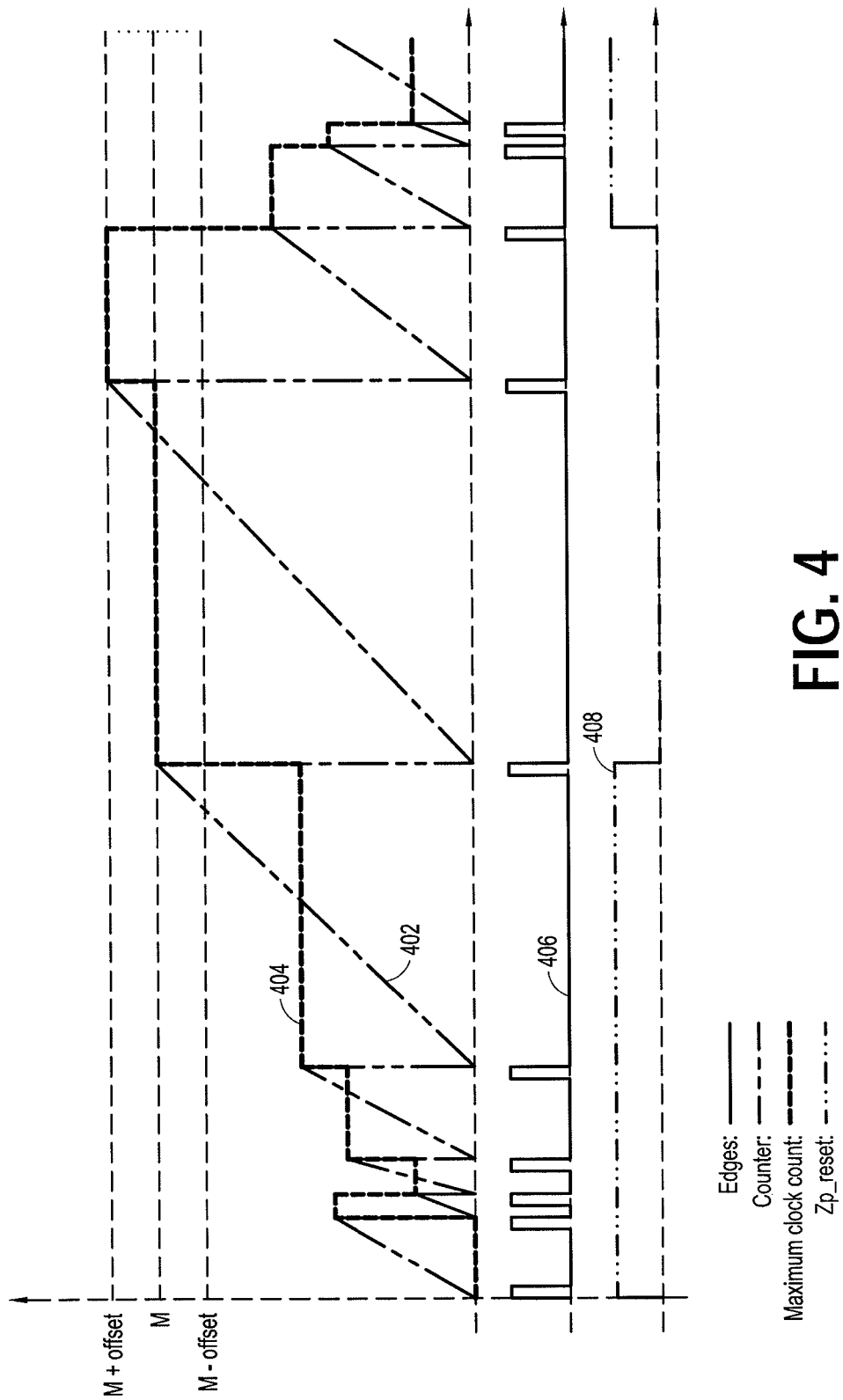
FIG. 4 is a timing diagram illustrating zero phase resetting according to one embodiment.

Referring to FIG. 4, a timing diagram illustrating zero phase resetting is described below. The timing diagram illustrates a waveform 402 corresponding to value of the counter 302, a waveform 404 corresponding to an output of the maximum clock count register 308, a waveform 406 corresponding to the edges signal, and a waveform 408 corresponding to the resulting zero phase reset signal. The illustrated diagram in FIG. 4 shows that when the maximum clock count value between two edges is outside the window of M+offset and M-offset, the zero phase reset value is set high. When the maximum clock count value between two edges is between M+offset and M-offset, the zero phase reset value is set low.

Figure 5:
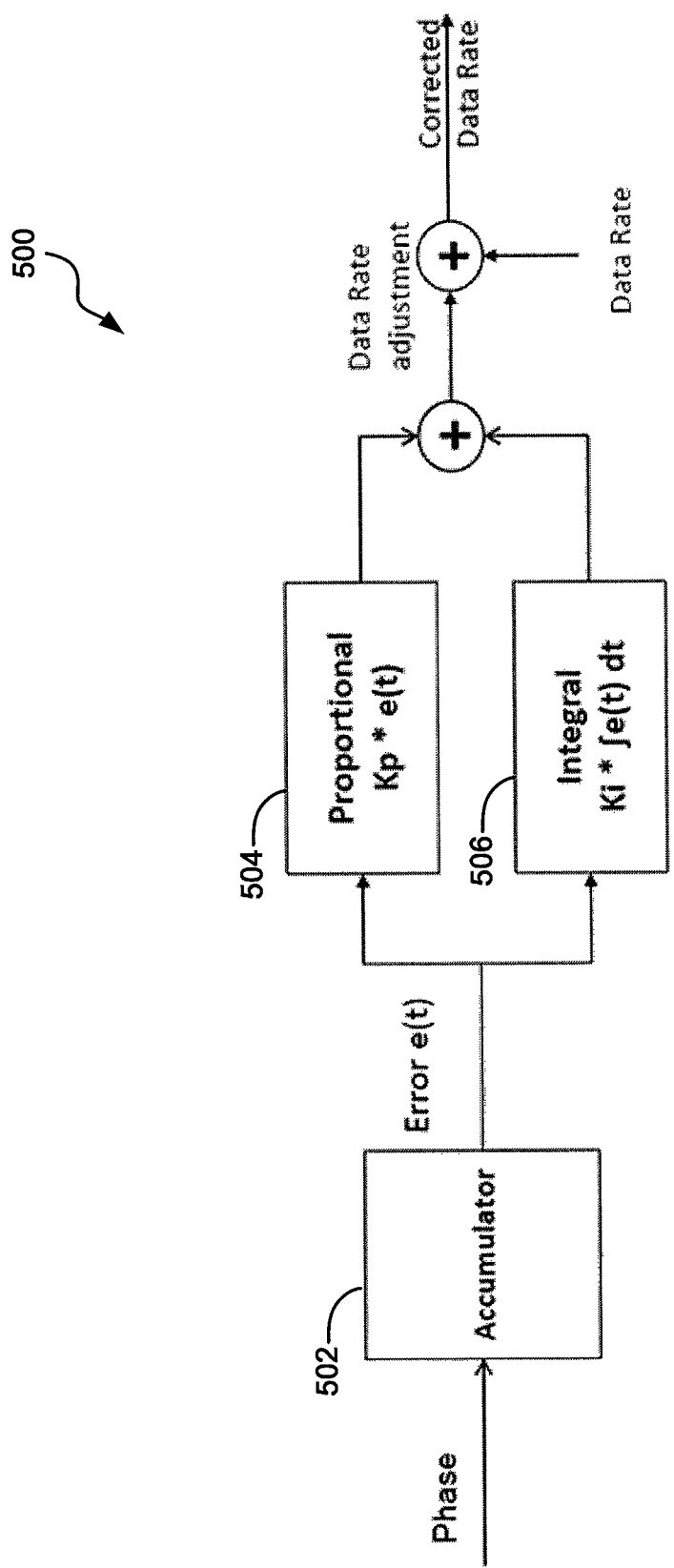
FIG. 5 is a schematic block diagram illustrating an example data rate correction system.

Referring to FIG. 5, an example data rate correction system will be described below. The illustrated system 500 includes an accumulator 502, a proportional controller 504, and an integral controller 506. The accumulator 502 receives the phase signal from the phase detector 106 in FIG. 1 and accumulates the phase signal to create an error signal. The error signal then goes through a proportional-integral (PI) controller to generate data rate adjustment value, where the proportional controller has a gain of $K_p$ and the integral controller has a gain of $K_i$. The data rate adjustment value is added to the data rate to generate a corrected data rate. The system 500 only illustrates one embodiment of data rate correction system, and the system 500 may be implemented using a different controller, for example.

Figure 6:
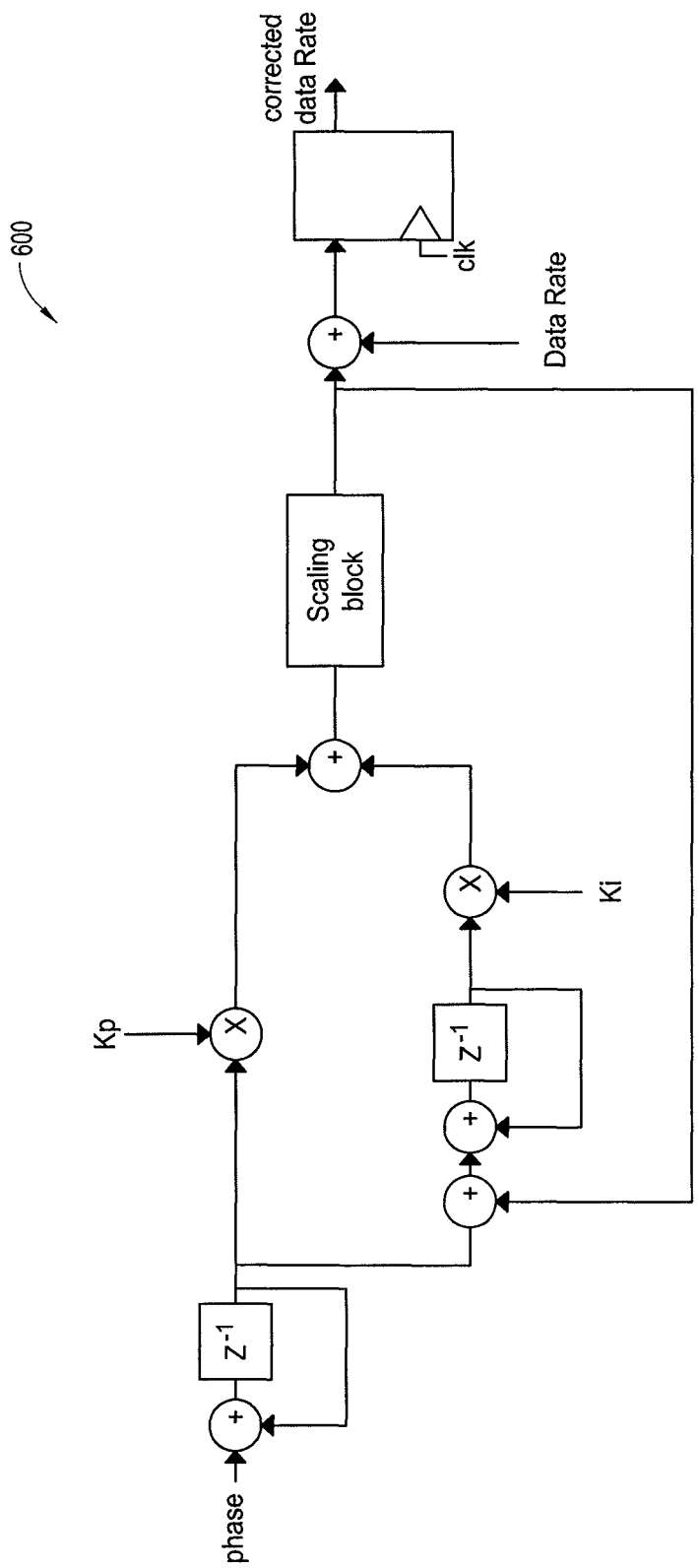
FIG. 6 is a schematic block diagram illustrating another example data rate correction system.

Referring to FIG. 6, another example data rate correction system will be described below. The illustrated system 600 includes an accumulation stage where the phase signal is accumulated to generate the error signal. The system 600 also includes a proportional controller with the gain $K_p$ and an integral controller with the gain $K_i$. The system 600 may also have a scaling block to generate a scaling factor to be added to the main data rate register to obtain a corrected data rate value, and the data rate adjustment and the data rate are summed to generate the corrected data rate.

Figure 7A:
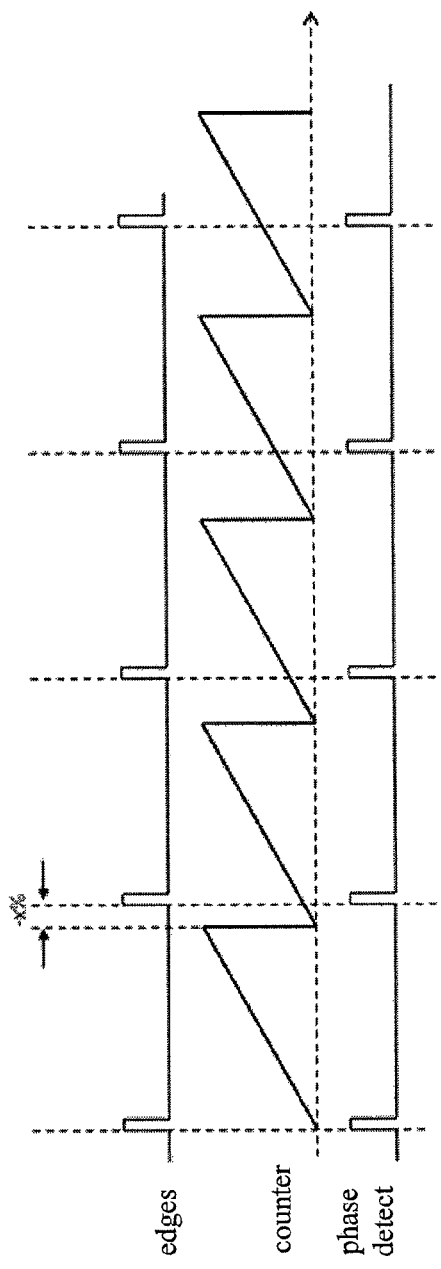
FIG. 7A is a timing diagram illustrating incoming data rate being lower than programmed data rate.

Referring to FIG. 7A, a timing diagram for a case of an incoming data rate being lower than a programmed data rate is described below. The timing diagram in FIG. 7A shows three signals: edges, counter, and phase detect. When the incoming data rate is lower than the programmed data rate by −x %, the counter value, which is based on the programmed data rate, resets to zero earlier than the edge of the incoming data. Accordingly, the phase detect signal may generate a positive unit impulse indicating that the positive phase error between the programmed data rate and the incoming data rate. Over time, the counter diagram drifts left from the edges signal.

Figure 7B:
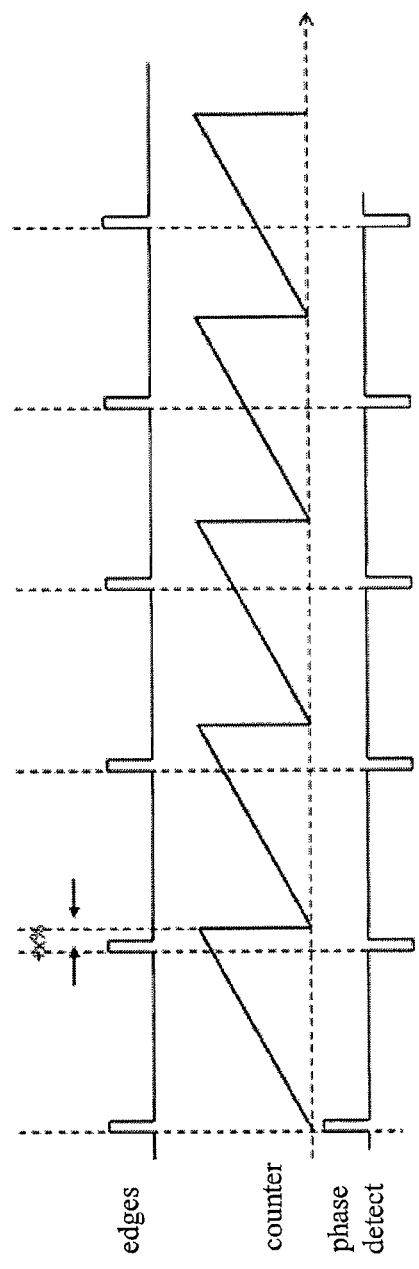
FIG. 7B is a timing diagram illustrating incoming data rate being higher than programmed data rate.

Referring to FIG. 7B, a timing diagram for a case of an incoming data rate being higher than a programmed data rate is described below. The timing diagram in FIG. 7B also shows three signals: edges, counter, and phase detect. When the incoming data rate is higher than the programmed data rate by +x %, the counter value, which is based on the programmed data rate, resets to zero later than the edge of the incoming data. Accordingly, the phase detect signal may generate a negative unit impulse indicating that the negative phase error between the programmed data rate and the incoming data rate. Over time, the counter diagram drifts right from the edges signal.

Figure 8A:
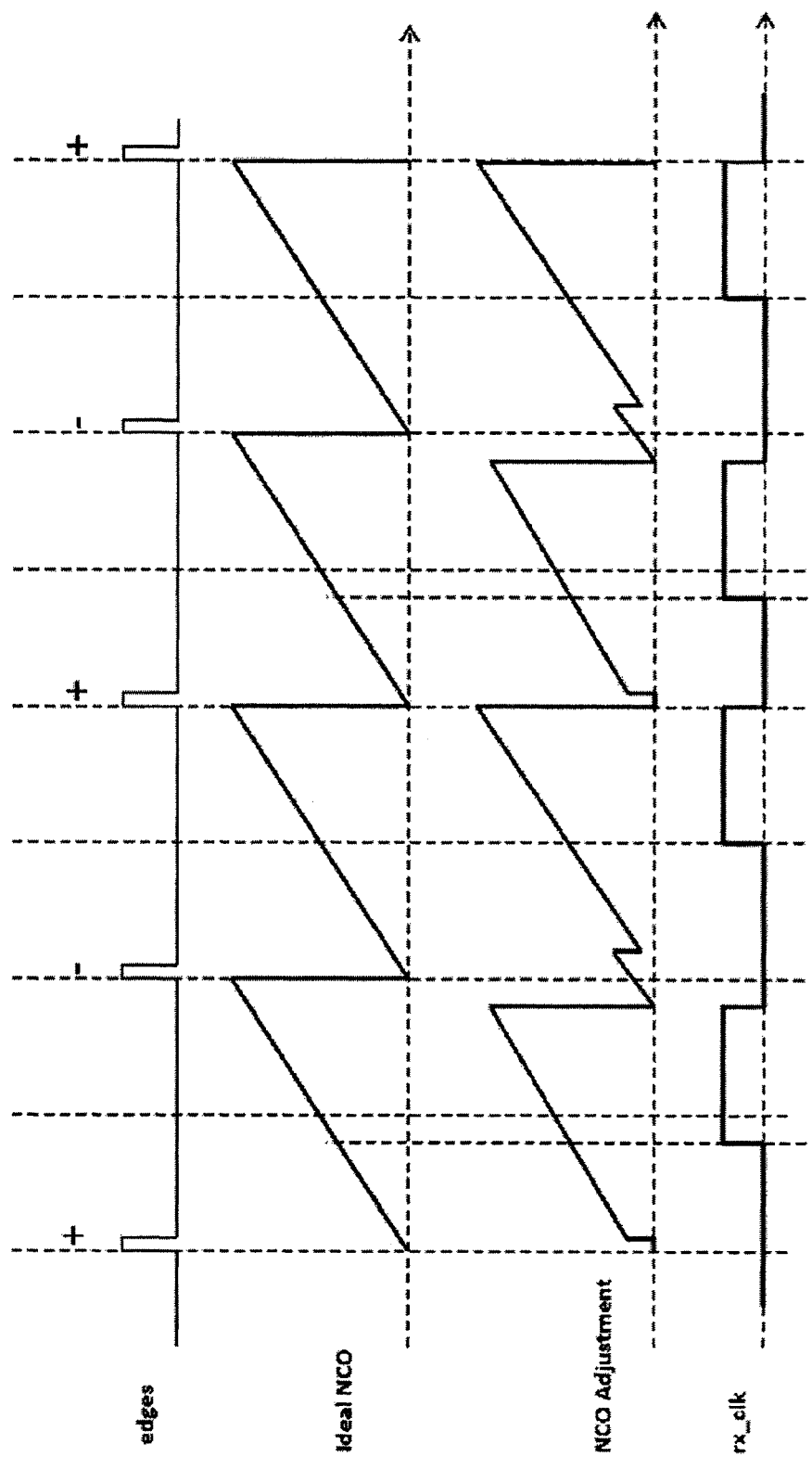
FIG. 8A is a timing diagram illustrating data rate correction for incoming data rate lower than programmed data rate

Referring to FIG. 8A, a timing diagram for data rate correction for an incoming data rate lower than a programmed data rate is described below. Similar to the illustration in FIG. 7A, the edges signal, which is at the incoming data rate, appears at a lower rate than the counter in FIG. 8A. The NCO Adjustment signal in FIG. 8A illustrates an adjusted version of the counter signal in FIG. 7A, which drifts left in FIG. 7A. Therefore, the NCO Adjustment signal can be repeatedly adjusted and no longer drifts left over time. The diagram in FIG. 8A further illustrates that the rx_clk signal is generated according to the NCO Adjustment signal.

Figure 8B:
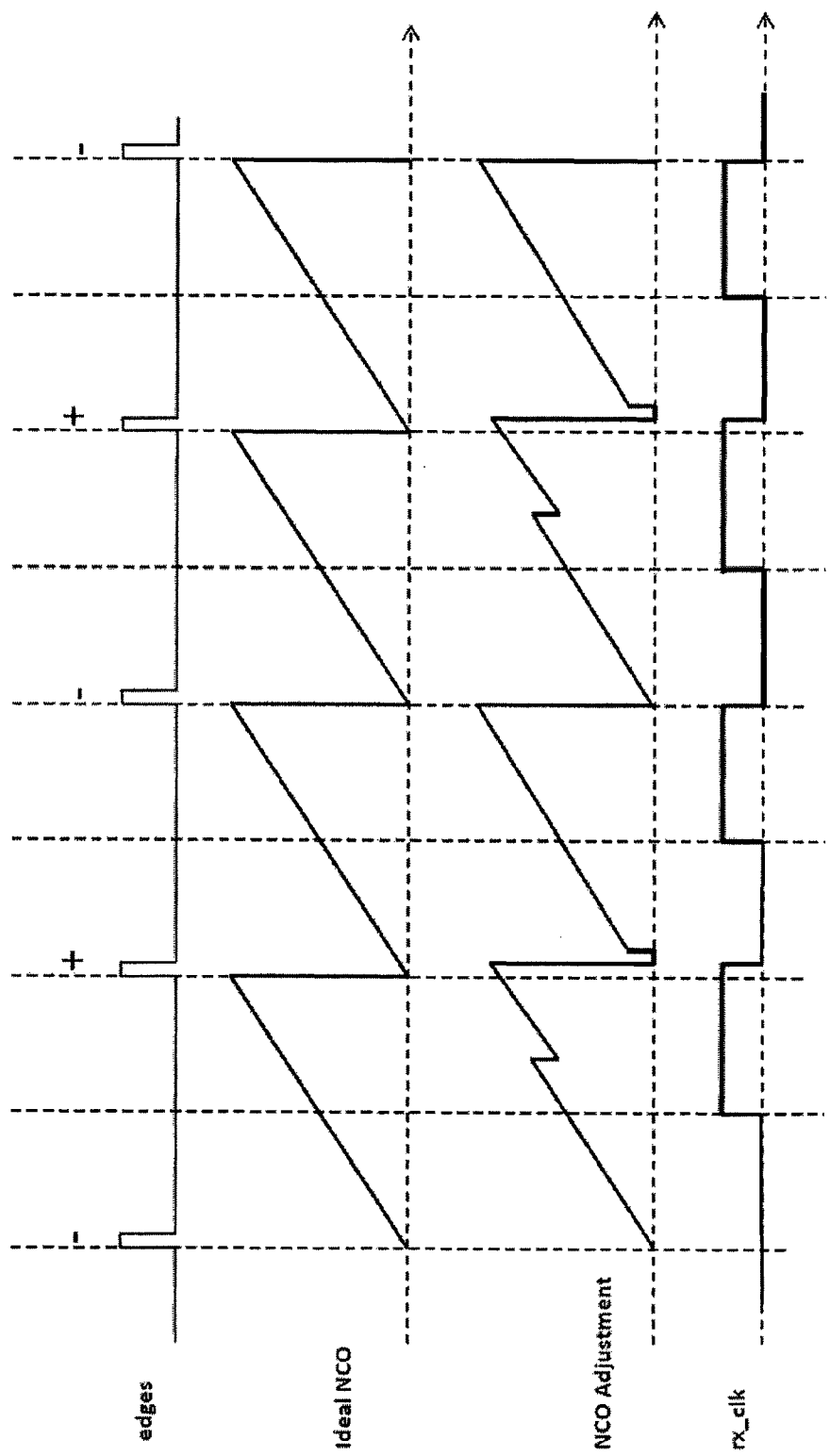
FIG. 8B is a timing diagram illustrating data rate correction for incoming data rate higher than programmed data rate.

Referring to FIG. 8B, a timing diagram for data rate correction for an incoming data rate higher than a programmed data rate is described below. Similar to the illustration in FIG. 7B, the edges signal, which is at the incoming data rate, appears at a higher rate than the counter in FIG. 8B. The NCO Adjustment signal in FIG. 8B illustrates an adjusted version of the counter signal in FIG. 7B, which drifts right in FIG. 7B. Therefore, the NCO Adjustment signal can be repeatedly adjusted and no longer drifts right over time. The diagram in FIG. 8B further illustrates that the rx_clk signal is generated according to the NCO Adjustment signal.

Figure 9:
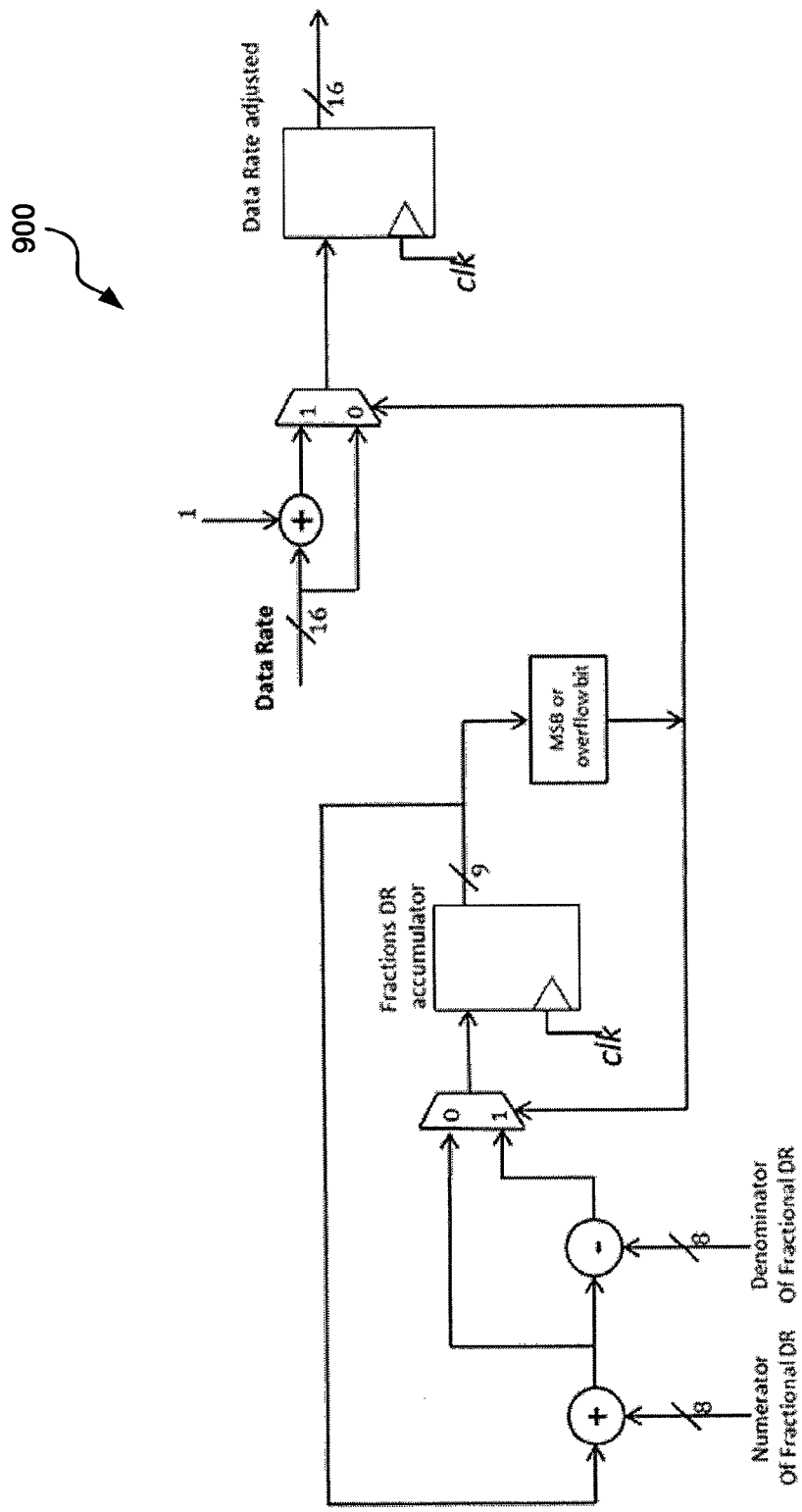
FIG. 9 is a schematic block diagram illustrating an example fractional data rate support system.

Referring to FIG. 9, an exemplary fractional data rate support system is described below. The illustrated system 900 includes among others programmable numerator and denominator registers and an accumulator that accumulates the numerator value. The system 900 allows a CDR circuit that is designed to use a set unit step approximate a target data rate that is not a multiple of the unit step rather than let the system accumulate fractional data rate error over time. The numerator register may be set to the numerator of the fractional difference between the actual data rate and the programmable CDR data rate so that the adjusted data rate may alternate between the programmed data rate and programmed data rate increased by one unit step. For example, the CDR system may be designed to use the unit step of 100 bps, and the target data rate may be 32768 bps. Without the fractional data rate support system, the CDR system has to be programmed to use either 32700 bps or 32800 bps to approximate 32768 bps. Instead with the illustrated system 900, the numerator register may be set at 68 and the denominator may be set at 100 in this example. The numerator value is accumulated over time, and the accumulated numerator value in excess of denominator value is calculated. Whenever the accumulated numerator value exceeds the denominator value the adjusted data rate is set at the programmed data rate increased by one unit step. Over time the data rate in the above example will be at 32800 bps for 68% of the time and 32700 bps for 32% of the time; thus closely approximating 32768 bps. The illustrated system 900 is only one embodiment of the alternating, or dithering, between two data rates to achieve a fractional data rate. The numbers of bits, for example, may be different from what are illustrated in FIG. 9; the two data rates, for example, may be more than one unit step apart; and the dithering, for example, may be accomplished in the opposite direction (having different signals for the final multiplexer in FIG. 9).

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Applications

Furthermore, the disclosed methods, systems, and/or apparatus can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, wireless devices, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus comprising:
    a signal processing circuit configured to acquire phase lock to an input signal in a first mode and to track the input signal in a second mode; and
    a reset circuit configured to:
        count cycles of a first clock signal between edges of the input signal to generate a count; and
        reset the signal processing circuit when the count is indicative of an absence of the input signal and while the signal processing circuit is in the first mode.

2. The apparatus of claim 1, wherein the signal processing circuit is reset based on a window defined by a first value associated with a data rate and a positive offset and a second value associated with the data rate and a negative offset.

3. The apparatus of claim 2, further comprising a data rate correcting circuit configured to adjust the data rate through a control loop according to a phase detect signal.

4. The apparatus of claim 3, wherein the data rate correcting circuit further comprises an accumulator to accumulate the phase detect signal and generate an error signal.

5. The apparatus of claim 1, wherein the signal processing circuit comprises a clock and data recovery (CDR) circuit, the CDR circuit being configured to perform clock and data recovery.

6. The apparatus of claim 5, wherein the CDR circuit comprises a first counter for a numerically-controlled oscillator and the reset circuit comprises a second counter, wherein the first counter is configured to receive the first clock signal and generate a second clock signal, wherein the second counter is configured to receive the first clock signal as an input.

7. The apparatus of claim 1, wherein the reset circuit comprises a counter and a window comparator.

8. The apparatus of claim 1, further comprising a fractional rate support circuit configured to dither between a first data rate and a second data rate to achieve a data rate between the first data rate and the second data rate.

9. The apparatus of claim 8, wherein a data rate of the input signal is greater than the first data rate and less than the second data rate.

10. An electronically-implemented method of signal processing, the method comprising:
    acquiring phase lock to an input signal in a first mode and tracking the input signal in a second mode;
    counting cycles of a first clock signal between edges of the input signal to generate a count; and
    resetting processing of the signal when the count is indicative of an absence of the input signal while in the first mode.

11. The method of claim 10, wherein the resetting is based on a window defined by a first value associated with a data rate and a positive offset and a second value associated with the data rate and a negative offset.

12. The method of claim 11 further comprising adjusting the data rate through a control loop according to a phase detect signal.

13. The method of claim 12, wherein an accumulator accumulates the phase detect signal and generates an error signal to adjust the data rate.

14. The method of claim 10 further comprising performing clock and data recovery.

15. The method of claim 14, wherein the clock and data recovery is performed as a first counter receives a first clock signal and generates a second clock signal, and a second counter receives the first clock signal as an input, wherein the first counter is for a numerically-controlled oscillator and the reset circuit counter for a reset circuit.

16. The method of claim 10, wherein a counter and a window comparator determine the count being indicative of the absence of the input signal in the first mode.

17. The method of claim 10, further comprising dithering between a first data rate and a second data rate to achieve a data rate between the first data rate and the second data rate.

18. The method of claim 17, wherein a data rate of the input signal is greater than the first data rate and less than the second data rate.

19. An apparatus for signal processing, the apparatus comprising:
    a signal processing circuit configured to acquire phase lock to an input signal in a first mode and to track the input signal in a second mode; and
    a means for counting cycles of a first clock signal between edges of the input signal to generate a count; and
    a means for resetting processing of the signal when the count is indicative of an absence of the input signal while in the first mode.

20. The apparatus of claim 19 further comprising performing clock and data recovery.

\* \* \* \* \*